(12) United States Patent
Shimizu et al.

(10) Patent No.: US 11,164,723 B2
(45) Date of Patent: Nov. 2, 2021

(54) METHODS AND APPARATUS FOR ETCHING SEMICONDUCTOR STRUCTURES

(71) Applicant: APPLIED MATERIALS, INC., Santa Clara, CA (US)

(72) Inventors: Daisuke Shimizu, Milpitas, CA (US); Taiki Hatakeyama, San Jose, CA (US); Sean S. Kang, San Ramon, CA (US); Katsumasa Kawasaki, San Jose, CA (US); Chunlei Zhang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/151,349

(22) Filed: Jan. 18, 2021

(65) Prior Publication Data

US 2021/0142987 A1     May 13, 2021

Related U.S. Application Data

(63) Continuation of application No. 16/777,220, filed on Jan. 30, 2020, now Pat. No. 10,930,471, which is a
(Continued)

(51) Int. Cl.
    *H01L 21/67*      (2006.01)
    *H01J 37/32*      (2006.01)
    *H01L 21/311*      (2006.01)

(52) U.S. Cl.
CPC ...... *H01J 37/32183* (2013.01); *H01J 37/321* (2013.01); *H01J 37/32449* (2013.01);
(Continued)

(58) Field of Classification Search
None
See application file for complete search history.

(56) References Cited

U.S. PATENT DOCUMENTS

| 10,593,518 B1 | 3/2020 | Shimizu et al. |
| 2003/0045114 A1 | 3/2003 | Ni et al. |

(Continued)

OTHER PUBLICATIONS

Banqiu Wu, Ajay Kumar, and Sharma Pamarthy, High Aspect Ratio Silicon Etch—a Review, Journal of Applied Physics 108, 051101 (2010) Applied Materials 974 E Arques Ave, M/S 81505, Sunnyvale, CA 94085, 20 pages.
(Continued)

*Primary Examiner* — Roberts P Culbert
(74) *Attorney, Agent, or Firm* — Moser Taboada

(57) ABSTRACT

Methods and apparatus for producing high aspect ratio features in a substrate using reactive ion etching (RIE). In some embodiments, a method comprises flowing a gas mixture of $C_3H_2F_4$ and a companion gas into a process chamber, forming a plasma from the gas mixture using an RF power source connected to an upper electrode above the substrate and at least one RF bias power source connected to a lower electrode under the substrate, performing an anisotropic etch, via the plasma, of at least one layer of oxide or nitride on the substrate using a pattern mask, reducing power of the at least one RF bias power source to produce deposition of a passivation layer on the at least one layer of oxide or nitride on the substrate, and evacuating the process chamber while interrupting the RF power source to stop plasma formation.

20 Claims, 5 Drawing Sheets

Related U.S. Application Data continuation of application No. 16/270,803, filed on Feb. 8, 2019, now Pat. No. 10,593,518.

(52) U.S. Cl.
CPC .. *H01L 21/67069* (2013.01); *H01J 2237/332* (2013.01); *H01J 2237/3341* (2013.01); *H01L 21/31116* (2013.01)

(56) References Cited

U.S. PATENT DOCUMENTS

| | | |
|---|---|---|
| 2007/0264841 A1 | 11/2007 | Chebi et al. |
| 2016/0013067 A1 | 1/2016 | Wang et al. |
| 2016/0276212 A1 | 9/2016 | Horikoshi |
| 2018/0204728 A1 | 7/2018 | Oomori |

OTHER PUBLICATIONS

International Search Report and Written Opinion for PCT/US2020/015155 dated May 20, 2020.

METHODS AND APPARATUS FOR ETCHING SEMICONDUCTOR STRUCTURES

CROSS-REFERENCE TO RELATED APPLICATIONS

This application is a Continuation of and claims the benefit of U.S. patent application Ser. No. 16/777,220, filed Jan. 30, 2020, which is a continuation of U.S. patent application Ser. No. 16/270,803, filed on Feb. 8, 2019 and issued as U.S. Pat. No. 10,593,518 on Mar. 17, 2020, both of which are herein incorporated by reference in their entirety.

FIELD

Embodiments of the present principles generally relate to semiconductor processing.

BACKGROUND

As the complexity of integrated circuits evolve, greater demands are placed on increasing the density of circuit features to improve performance. To increase density, manufacturers must continually shrink the sizes of individual features in order to fit more features in a given space. In addition, three-dimensional features may be used to further progress the density of a given area of a substrate during semiconductor manufacturing. Multiple circuit layers may also be constructed to allow more and more features for a given area of the substrate. The addition of three dimensional features and multi-layered circuits may also require features with high aspect ratios that can be formed through many layers of the substrate to interconnect parts of the circuits. As the aspect ratios increase, the reliability of the features may be reduced if the production techniques, such as etching, cause imperfections in the features. A feature such as a hole or trench that is not properly formed may cause a decrease in density and reliability. Thus, the inventors have found that producing features with well-formed critical dimensions (CD) is crucial to meeting the ever increasing circuit density demands. Moreover, producing high aspect ratio features in multi-layered substrates that use alternating layers of silicon oxide and silicon nitride, such as in an ONON film stack, can prove challenging and costly in both resources and time.

Accordingly, the inventors have provided improved methods and apparatus for etching semiconductor structures on a substrate.

SUMMARY

Methods and apparatus for etching semiconductor structures are provided herein.

In some embodiments, a method for etching a substrate comprises flowing a gas mixture of $C_3H_2F_4$ and a companion gas into a process chamber, forming a plasma from the gas mixture using an RF power source connected to an upper electrode above the substrate and at least one RF bias power source connected to a lower electrode under the substrate, performing an anisotropic etch, via the plasma, of at least one layer of oxide or nitride on the substrate using a pattern mask, reducing power of the at least one RF bias power source to produce deposition of a passivation layer on the at least one layer of oxide or nitride on the substrate, and evacuating the process chamber while interrupting the RF power source to stop plasma formation.

In some embodiments, the method may further comprise pulsing the RF power source to form the plasma and pulsing the at least one RF bias power source to assist in ion attraction towards the substrate; linking the RF power source to the at least one RF bias power source and respective impedance matching networks to adjust RF power delivery to the process chamber on an order of microseconds; forming the plasma with the RF power source operating at a frequency of approximately 100 MHz to approximately 200 MHz and performing the anisotropic etch with the at least one RF bias power source operating at a frequency less than approximately 6 MHz; wherein the RF power source has a peak power level less than the at least one RF bias power source; repeating the method to form at least one hole through a plurality of alternating oxide and nitride layers on the substrate to expose portions of the substrate; performing a dynamic ramping of at least one process parameter; wherein the at least one process parameter is a gas flow rate, an RF power source, a bias power source, or a pressure of the process chamber; dynamically ramping the at least one process parameter based on a processing time or etch depth; wherein the companion gas is a fluorocarbon gas of $C_3F_6$; and/or etching alternating layers of oxide and nitride on the substrate with the gas mixture of $C_3H_2F_4$ and the companion gas having an oxide to nitride selectivity of approximately 1:1.

In some embodiments, a method for etching a substrate comprises flowing a gas mixture of $C_3H_2F_4$ and a companion gas into a process chamber, the gas mixture having an oxide to nitride etching selectively of approximately 1:1; generating a first RF power pulse of an RF power source connected to an upper electrode above the substrate to form plasma in the process chamber; generating a first RF bias power pulse of at least one RF bias power source connected to a lower electrode under the substrate during the first RF power pulse to perform an anisotropic etch, via the plasma, of at least one layer of oxide or nitride on the substrate using a pattern mask, a duration of the first RF bias power pulse being less than a duration the first RF power pulse; depositing a passivation layer on the at least one layer of oxide or nitride on the substrate during the first RF power pulse when the first RF bias power pulse is completed; and evacuating the process chamber when the first RF power pulse is completed.

In some embodiments, the method may further comprise generating the first RF bias power pulse with a first RF bias power source of the at least one RF bias power source at a frequency of approximately 400 kHz and a second RF bias power source of the at least one RF bias power source at a frequency of approximately 2 MHz; generating the first RF power pulse with the RF power source at a frequency of approximately 121 MHz; ramping a power level of the first RF power pulse upward for subsequent RF power pulses to a peak power of approximately 3 kW to approximately 4 kW at a rate of approximately one kilowatt per second to approximately two kilowatts per second; ramping a power level of the first RF bias power pulse upward for subsequent RF bias power pulses to a peak power of approximately 10 kW to approximately 15 kW at a rate of approximately one kilowatt per second to approximately two kilowatts per second; ramping a flow rate of the gas mixture downward based on processing time or etch depth; ramping a power level of pulses of the RF power source or the RF bias power source upward based on processing time or etch depth; and/or dynamically ramping one or more process parameters to provide active aspect ratio dependent etching control for selective reactive ion etching by depth.

In some embodiments, a non-transitory computer readable medium having instructions stored thereon that, when executed, cause a method of operating a substrate processing system to be performed, the method comprises flowing a gas mixture of $C_3H_2F_4$ and a companion gas into a process chamber, the gas mixture having an oxide to nitride etching selectively of approximately 1:1; generating a first RF power pulse of an RF power source connected to an upper electrode above a substrate to form plasma in the process chamber; generating a first RF bias power pulse of at least one RF bias power source connected to a lower electrode under the substrate during the first RF power pulse to perform an anisotropic etch, via the plasma, of at least one layer of oxide or nitride on the substrate using a pattern mask, a duration of the first RF bias power pulse being less than a duration the first RF power pulse; depositing a passivation layer on the at least one layer of oxide or nitride on the substrate during the first RF power pulse when the first RF bias power pulse is completed; and evacuating the process chamber when the first RF power pulse is completed.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1A:
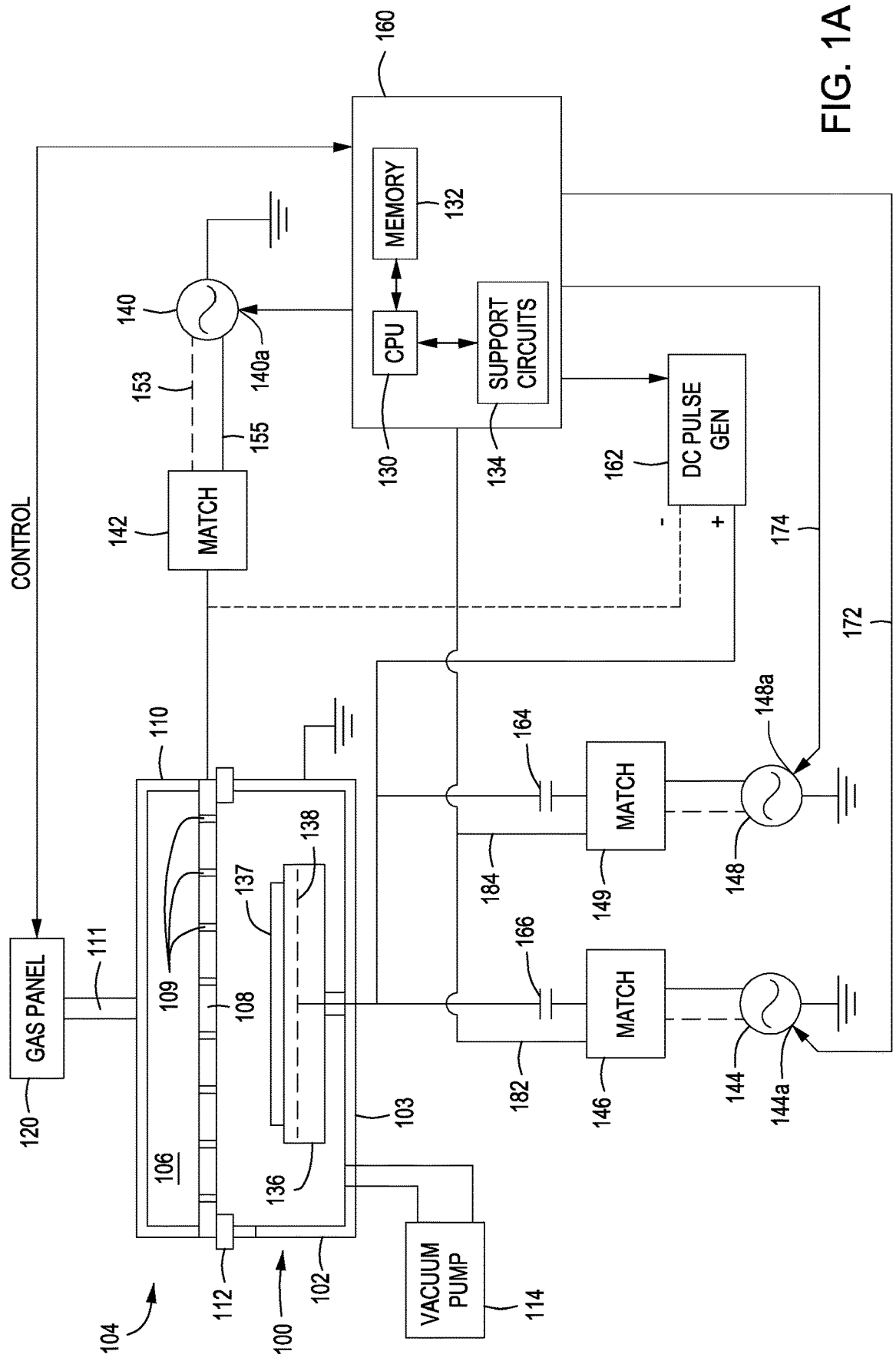
FIG. 1A depicts a plasma reactor in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide increased critical dimension (CD) uniformity in reactive ion etching (RIE) of high aspect ratio features in oxide and nitride layered substrates. The process sequence is greatly simplified, significantly reducing the operator's tasks, and may reduce processing time to under approximately 800 seconds. Pattern mask integrity is also greatly improved while increasing bow protection of the features and eliminating hole distortion—increasing both reliability and feature density. The processes of the present principles also eliminate ion deflection into the features and the resulting bow of the feature sidewalls caused by deflected ion etching. Bow in a bottom CD of a hole is improved to less than approximately five nanometers. Entrance clogging of the features (necking) during etching is significantly reduced, eliminating the need for trim processes, saving processing time and reducing costs. The need for using a chemical vapor deposition (CVD) chamber for depositing a conformal liner material is also advantageously eliminated.

The methods and apparatus of the present principles advantageously allow the highest aspect ratio for contact applications and bridge applications by overcoming challenges in etching selectivity control and sidewall bow control and the like. Aspect ratios of greater than approximately 50:1 may be achieved. Because the methods and apparatus allow for microsecond control adjustments of the processes, the features formed in a multilayered stack of oxide and nitride materials on a substrate have smooth sidewalls and high aspect ratios, increasing both performance and reliability. Multiple linked (e.g., master/slave) RF power sources are used to provide individual control of a plasma power source and at least one bias power source. The RF power sources use a control schema which allows pulsing of the power sources at various times during a cycle with almost instantaneous adjustments that can be based on processing timing and/or etching depth. The processes also utilize a process gas mixture of a $C_3H_2F_4$ gas with a companion gas (e.g., a fluorocarbon gas such as, for example, $C_3F_6$, and the like). The gas mixture provides an approximately 1:1 etch selectivity of oxide materials to nitride materials. The chemistry of the gas mixture and other gases aid in precisely controlling the etching process to yield smooth sidewalls for high aspect ratio features even when the etched material alternates between oxide and nitride.

The methods also utilize dynamic parameter ramping (DPR) to accurately and smoothly control increases and decreases (i.e., upward/downward ramping) in a parameter's value in response to timing and/or etching depth. DPR may be used to control, for example, process chamber pressure, RF plasma power, RF bias power, process gas flow rates, and/or inert gas flow rates, etc. DPR allows adjustments to be made to avoid pattern mask clogging, especially in the top area (necking), by adjusting parameters during the etch process. In addition, DPR may control an etching assistance gas such as $O_2$ to avoid over etching the pattern mask and sidewall bow during the initial stages of an etching process (e.g., ramping $O_2$ gas upward as etching depth increases to provide active control based on etch depth without overly depleting the pattern mask in the initial etching stages). The precision control of the processes avoids closure of the top of a feature (necking) during etching and promotes smoother and faster etch processes. By avoiding necking, the etching process can continue uninterrupted and ion deflection that attacks the sidewalls of the feature (i.e., bow) is avoided. During conventional RIE processes, trimming is required to remove the necking before a protective liner for the sidewalls is deposited in a separate CVD chamber. The methods and apparatus of the present principles eliminates the trim process altogether and uses only a single process chamber, saving both significant costs and processing time.

The methods of the present principles include an etching mode, a deposition mode, and an evacuation mode. The overall time-multiplexed etching process is performed by impedance tuning for multiple RF pulse frequencies that alternate repeatedly among the three modes to achieve high aspect ratio structures with near vertical profiles (feature sidewalls of approximately 80 degrees to approximately 90 degrees perpendicular to a surface being etched). The RF power source pulsing control can make process adjustments on the order of microseconds. The process adjustment speed and the special gas mixture with an approximately 1:1 oxide to nitride selectivity along with the DPR control allow management of necking and sidewall bow (e.g., ion deflection into feature sidewalls). A protective deposition layer is also applied to a substrate after etching to aid in bow control and to provide a protective cap on top edges of the pattern mask to keep ions from deflecting into a feature's sidewalls. After the deposition mode, gases and byproducts are pumped out of the process chamber as part of the evacuation mode. Because the entrance to the pattern mask is kept clear, the protective layer can be delivered deeper into the feature and ion and etching reaction gases can go deeper into the feature, allowing for very smooth etching. The present techniques also allow for operators in a production line to easily troubleshoot any problems and determine where and what mode is affected, reducing downtime and costs.

FIG. 1A depicts a plasma reactor which may be utilized to perform the methods disclosed herein. The methods may be performed in a capacitively coupled plasma reactor (e.g., as illustrated in FIG. 1A) or any other suitable plasma reactor, such as an inductive coupled plasma reactor. The plasma reactor of FIG. 1A includes a process chamber 100 enclosed by a cylindrical side wall 102, a floor 103, and a lid 104. In some embodiments, the lid 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., lid 104) is electrically insulated from the cylindrical side wall 102 by an insulating ring 112. A vacuum pump 114, such as a turbomolecular pump, is capable of evacuating the process chamber 100 of gases and by-products and maintains the pressure inside of the process chamber 100. A gas panel 120 controls the individual flow rates of different process gases to the gas supply inlet 111. A support pedestal 136 supported through the floor 103 of the process chamber 100 may have an insulating top surface and an internal electrode 138. The internal electrode 138 may, for example, be used for supplying bias power during processing.

Power may be applied to the processing chamber 100 from a plurality of RF generators 140, 144, 148. The plurality of RF generators 140, 144, 148, includes a master RF generator 140 and one or more slave RF generators 144, 148. Plasma source power is applied to the lid 104 (also referred to herein as a gas distribution showerhead) from the master RF generator 140 through an impedance matching network 142. The lid 104 or gas distribution showerhead is formed of a conductive material, such as aluminum for example, and therefore serves as a lid electrode. In some embodiments, the master RF generator 140 may generate VHF power in the high portion of the VHF spectrum, such as in a range of approximately 100 MHz to approximately 200 MHz. The master RF generator 140 has the capability of pulsing the power generated at a desired pulse rate and duty cycle. For example, the master RF generator 140 has a pulse control input 140a for receiving a control signal or signals defining the pulse rate and/or duty cycle as well as the phase of each pulse produced by the master RF generator 140. The master RF generator 140 may be connected to the impedance matching network 142 via high speed link cable 153 and RF cable 155. The master RF generator 140 may be connected to the first slave RF generator 144 via high speed link cable 172. The master RF generator 140 may be connected to the second slave RF generator 148 via high speed link cable 174. The master RF generator 140 may be connected to the impedance matching networks 142, 146, and 149, via high speed link cables 153, 182, and 184, respectively.

In some embodiments as shown in FIG. 1A, bias power is applied to the internal electrode 138 from a first slave RF generator 144 through an impedance matching network 146 and a second slave RF generator 148 through an impedance matching network 149. In some embodiments, the first slave RF generator 144 and the second slave RF generator 148 may apply bias power while the master RF generator 140 applies plasma source power. The one or more slave RF generators 144, 148 may generate high frequency (HF) or low frequency (LF) power in the LF spectrum to a low portion of the HF spectrum, such as in a range of approximately 30 kHz to approximately 6 MHz. For example, the first slave RF generator 144 and the second slave RF generator 148 may generate power at approximately 2 MHz and approximately 400 kHz, respectively. The one or more slave RF generators 144, 148 have the capability of pulsing the power generated at a desired pulse rate and duty cycle. For example, the one or more slave RF generators 144, 148 have pulse control inputs 144a, 148a for receiving a control signal or signals defining the pulse rate and/or duty cycle as well as the phase of each pulse produced by the one or more slave RF generators 144, 148. The one or more slave RF generators 144, 148 may be independently pulsed, phased, and/or duty cycle controlled. Further, the one or more slave RF generators 144, 148 may be pulsed synchronously or asynchronously.

In some embodiments, the impedance matching networks 142, 146, 149 may be formed by one or more capacitors and/or an inductor. The values of capacitor may be electronically or mechanically tuned to adjust the matching of each of the impedance matching networks 142, 146, 149. In lower power systems, the one or more capacitors may be electronically tuned rather than mechanically tuned. In some embodiments, the impedance matching networks 142, 146, 149 may have a tunable inductor. In some embodiments, one or more of the capacitors used in the impedance matching networks 142, 146, 149 may be one or more fixed capacitors or series capacitors. In other embodiments, one or more of the capacitors used in the impedance matching networks 142, 146, 149 may be a variable capacitor, which may be electronically or mechanically tuned to adjust the matching of the impedance matching networks 142, 146, 149. In some embodiments, one or more of the impedance matching networks 142, 146, 149 may have a capacitive shunt to ground.

A controller 160 is programmable to apply pulse control signals to each of the pulse control inputs 140a, 144a, 148a of the plurality of RF generators 140, 144, 148 to produce the desired phase lead or lag relationship and/or duty cycle relationship among the pulses of the master RF generator 140 and the slave RF generators 144, 148. The controller 160 may also control other aspects of the tool/process chamber. Although shown as a separate component in FIG. 1A, in some embodiments, the controller 160 can be disposed internally inside of each RF generator. Synchronization signals would be generated at a master RF generator (e.g., master RF generator 140), and sent to other slave generators (e.g., slave RF generators 144, 148). The controller 160 may also load and execute gas recipes to be used in pre-processing, etching of features, and post processing. The controller 160 may be used to control process sequences and regulate gas flows from the gas panel 120.

In some embodiments, the RF generators 140, 144, 148, the impedance matching networks 142, 146, 149, and/or the controller 160 comprise a central processing unit (CPU) 130, a plurality of support circuits 134, and a memory 132. While the present exemplary embodiments of the plurality of RF generators 140, 144, 148, the impedance matching networks 142, 146, 149, and controller 160 are discussed with respect to a computer having a CPU, support circuits, and a memory, one of ordinary skill in the art would recognize that the plurality of RF generators 140, 144, 148, the impedance matching networks 142, 146, 149, and controller 160 could be implemented in a variety of ways, including as an application specific interface circuit (ASIC), a field-programmable gate array (FPGA), a system-on-a-chip (SOC), and the like. Various embodiments of the controller 160 may also be integrated within other process tool controllers, with corresponding input/output interfaces as known in the art.

The support circuits 134 may include a display device as well as other circuits to support the functionality of the CPU 130. Such circuits may include clock circuits, cache, power supplies, network cards, video circuits and the like. The memory 132 may comprise read only memory, random access memory, removable memory, disk drives, optical drives and/or other forms of digital storage. The memory 132 is configured to store an operating system, and a sub-fab control module. The operating system executes to control the general operation of the plurality of RF generators 140, 144, 148, the impedance matching networks 142, 146, 149, and controller 160, including facilitating the execution of various processes, applications, and modules to control the one or more RF generators 140, 144, 148 or the impedance matching networks 142, 146, 149 in order to perform the methods discussed herein.

Further, a DC generator 162 may be coupled to either (or both) the internal electrode 138 and the lid 104. In some embodiments, DC generator 162 may supply continuous and/or variable DC. In some embodiments, DC generator 162 may provide pulsed DC power. The pulse repetition rate, phase and duty cycle of the DC generator are controlled by the controller 160. A DC isolation capacitor 164, 166 may be provided to isolate each slave RF generator 148, 144, respectively, from the DC generator 162. A DC signal generated by the DC generator may be synchronized with the RF signals generated by the RF generators 140, 144, 148 to provide benefits such as reduced charge-up on a substrate 137 or improved etch rate control of the substrate using a plasma formed in the plasma reactor.

Figure 1B:
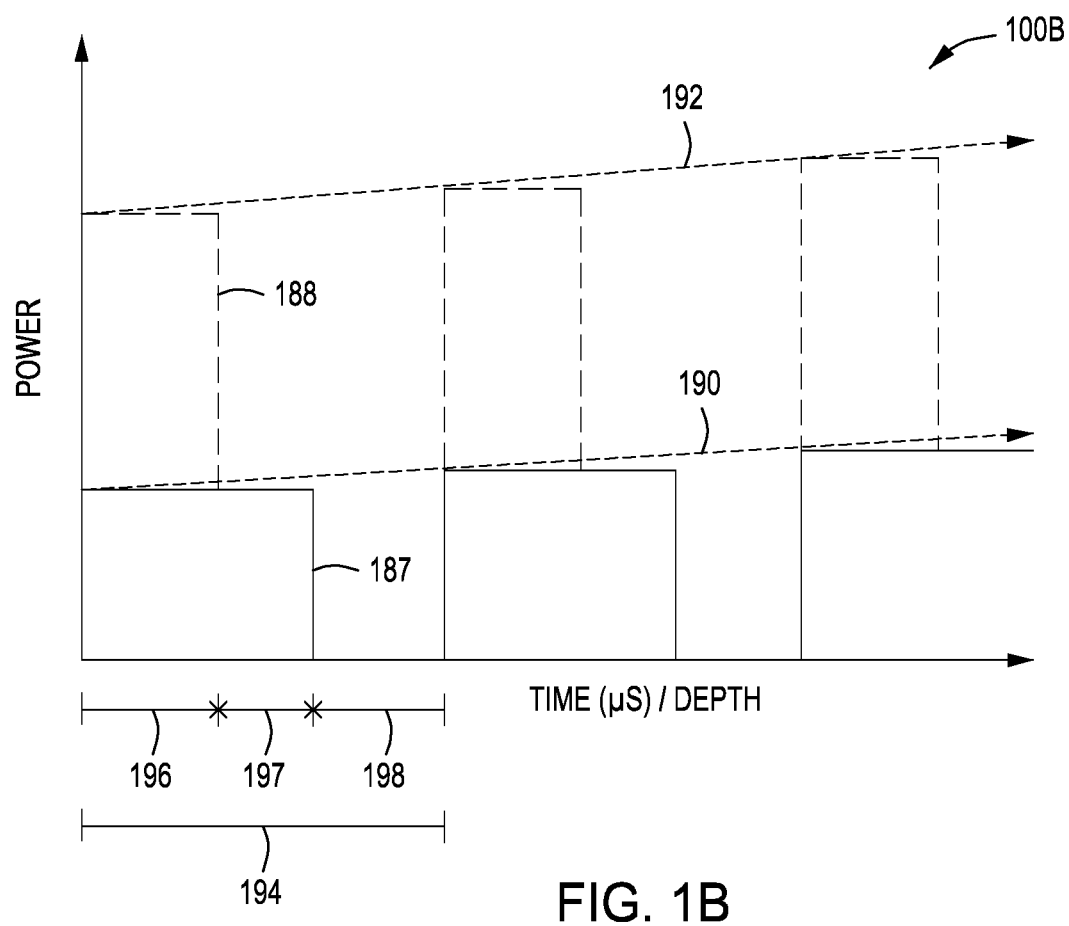
FIG. 1B depicts a graph of RF pulse timing for the plasma reactor of FIG. 1A in accordance with some embodiments of the present principles.

The RF generators 140, 144, 148 may be adjusted on the order of microseconds. The fast control of the RF generators 140, 144, 148 allows for precise control of the methods of the present principles. In some embodiments, as shown in FIG. 1B, the RF generators 140, 144, 148 may be controlled according to the graph 100B. The interlinking with transistor-transistor-logic (TTL) signals of the RF generators 140, 144, 148 in the master/slave relationship and the respective impedance matching networks 142, 146, 149 allows for microsecond timing of pulses generated by the respective RF generator. The RF master or slave generators provide the TTL signals for synchronization to RF matches. Target impedance is calculated by averaging from multiple impedances detected in each interval or period allowing for fast RF power changes without RF power losses due to impedance mismatches.

The master RF generator 140 may produce a plasma pulse 187 with a first duration of a first cycle 194. During the first cycle 194, the slave RF generators 144, 148 generate a bias pulse 188 for a second duration shorter than the first duration. In some embodiments, an etching period 196 may occur during the overlap period of the plasma pulse 187 and the bias pulse 188. In some embodiments, in the part of the first duration of the plasma pulse 187 without the bias pulse 188, a deposition period 197 may occur within the process chamber 100. In some embodiments, a chamber cleansing period 198 (e.g., chamber gas and by-product evacuation) may occur in the period of the first cycle 194 without the plasma pulse 187 and the bias pulse 188.

In some embodiments, the power level of the plasma pulse 187 may be increased (arrow 190) or decreased for each pulse over a given amount of time or for a given amount of etching depth in a process. In some embodiments, the power level of the bias pulse 188 may be increased (arrow 192) or decreased for each pulse over a given amount of time or for a given amount of etching depth in a process. In some embodiments, each of the slave RF generators 144, 148 supplying bias power may be pulsed independently at different levels, in phase or out of phase. In some embodiments, bias power may be adjusted by adjusting the bias voltage levels.

Figure 2:
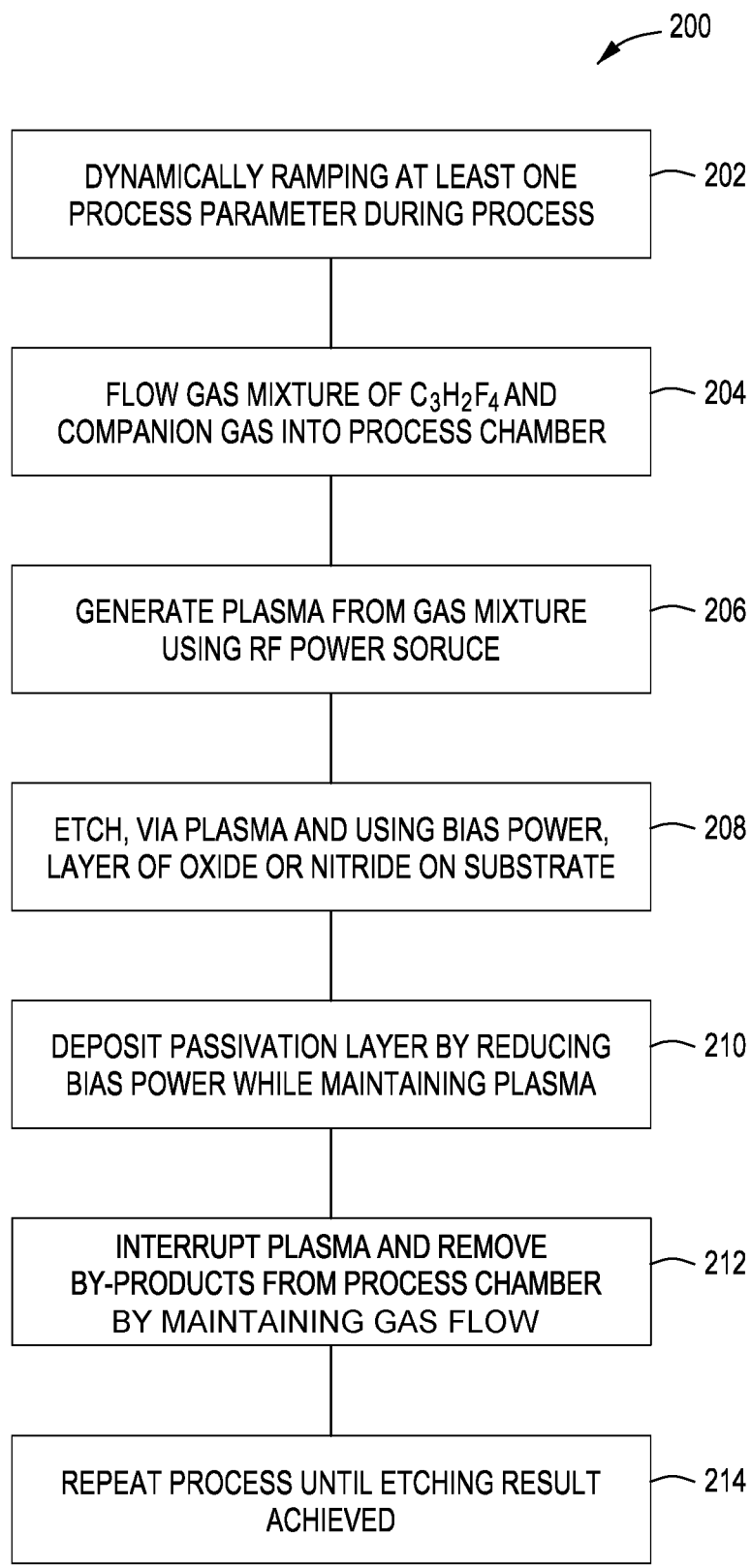
FIG. 2 is a method of etching oxide or nitride layers on a substrate in accordance with some embodiments of the present principles.

In FIG. 2, a method 200 of etching oxide and/or nitride layers on a substrate in accordance with some embodiments is illustrated. In some embodiments, the substrate temperature may be approximately 50 degrees Celsius to approximately 100 degrees Celsius during the processes. As shown in block 202, at least one process parameter is dynamically ramped during the etching process. The process parameter may be ramped upward and/or be ramped downward during a given process. The dynamic parameter ramping (DPR) of the process parameter may occur over a given time period (e.g., the time to complete the process, a given amount of time such as 500 seconds, etc.) or may occur based on an etching depth. The ramping may be indicated by a delta change over time or depth such as a plus or minus percentage of change from a starting value. DPR can activate a ramping slope (upward or downward) for active aspect ratio dependent etching (ARDE) control yielding selective RIE by depth.

By dynamically ramping process parameters, a higher quality etching process is obtained for high aspect ratio features on a substrate. In some embodiments, as described above, the dynamic ramping may be adjusted on a pulse by pulse basis on the order of microseconds and/or may also be made on a continuous basis over time. In some embodiments, process power requirements such as plasma source power and/or biasing power may be ramped upward and/or downward as the etching depth increases. Increasing the bias power permits better anisotropic etching at the bottom of holes, for example, as the hole depth increases. In some embodiments, process gas flow rates and/or inert gas flow rates may also be dynamically ramped upward and/or downward. In some embodiments, the inert gas flow rates remain constant.

Figure 3:
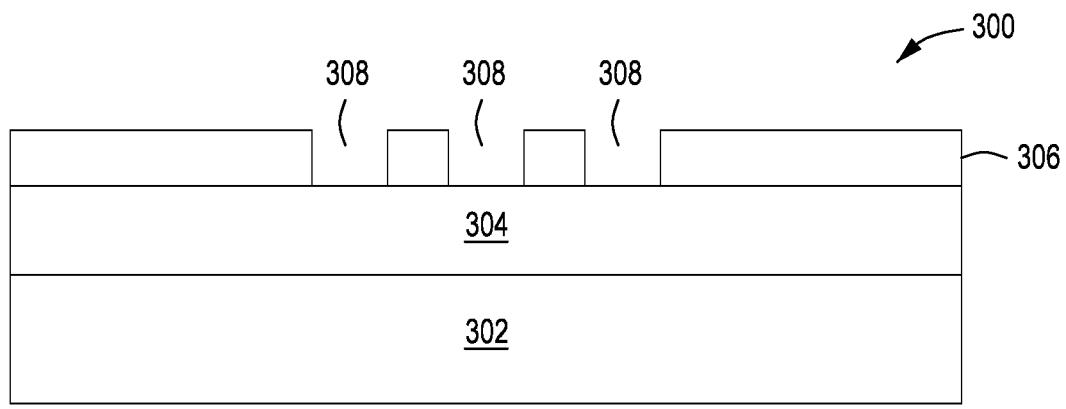
FIG. 3 is a cross-sectional view of a substrate with a layer of oxide and/or nitride and an etching mask in accordance with some embodiments of the present principles.

The method 200 allows a single chamber to perform etching and deposition processes with a given gas mixture. The etching creates features such as holes and/or trenches in oxide and/or nitride layers on a substrate. The deposition provides a protective layer or chemically inert passivation layer on the substrate to protect a pattern mask and sidewalls of features on the substrate. FIG. 3 depicts a cross-sectional view 300 of a substrate 302, such as substrate 137 of FIG. 1A, with an oxide or nitride layer 304 (nitride layer 304 may also be composed of multiple alternating layers of oxide and nitride materials). A pattern mask 306 has been formed on the oxide or nitride layer 304 with openings 308. The pattern mask 306 may be a photoresist mask or a hard mask.

In block 204, a gas mixture of $C_3H_2F_4$ and a companion gas is flowed into process chamber 100. The gas mixture provides a selective high aspect ratio process that provides a higher pattern mask selectivity for etching single layer and/or oxide-nitride multi-stacks. In some embodiments, the gas mixture may be disposed in the process chamber along with a carrier gas such as $O_2$ in addition to inert gases and other process gases. In some embodiments, the gases may be flowed into the process chamber separately or together at flow rates greater than 0 sccm to approximately 1000 sccm. In some embodiments, the process chamber has a pressure of approximately 5 mTorr to approximately 50 mTorr. The gas mixture provides the basis for ions and radicals that provide an etching selectivity ratio of oxide to nitride of approximately 1:1. In some embodiments, the companion gas is a fluorinated gas with a formula of $C_xF_y$, where each x and y are at least 1. Other gases may be added to the gas mixture to improve or control oxide and/or nitride etch rates such as, for example, hydrogen-free fluorocarbons and the like. In some embodiments, the gas mixture and/or flow rates may be controlled such that an etch selectivity of oxide/nitride compared to the pattern mask may be approximately 5:1 to approximately 7:1.

In some embodiments, the gas mixture has a flow rate of approximately 100 sccm to approximately 200 sccm. In some embodiments, an inert gas such as, for example, argon, krypton, and/or nitrogen is also flowed into the chamber with a flow rate of approximately 100 sccm to approximately 200 sccm. In some embodiments, a carrier gas such as $O_2$ may be introduced into the process chamber at a rate of 100 sccm and may be subject to DPR control. In some semiconductors, a layer of oxide is alternated with a layer of nitride. With an approximately 1:1 selectivity ratio, the oxide and nitride can be etched at the same rate with a single gas mixture. In some embodiments, the flow rate of the gas mixture is dynamically ramped downward over time or as the etching depth increases.

In block 206, plasma is generated from the gas mixture. The gas mixture is ionized and produces ions and radicals that can etch oxide or nitride materials. In some embodiments, the gas mixture is ionized in the presence of $O_2$ to produce plasma with a plurality of ions, radicals, and various molecules. In some embodiments, the gases may be present in the process chamber at a volume percentage ratio of the gas mixture ($C_3H_2F_4$ and a companion gas) to the carrier gas from approximately 80:20 to approximately 30:70. In some embodiments, the gases may be present in the process chamber at a volume percentage ratio of the gas mixture ($C_3H_2F_4$ and a companion gas) to the carrier gas from approximately 15:85 to approximately 25:75. In some embodiments, the volume percentage ratio of the carrier gas to the $C_3H_2F_4$ in the process chamber is from approximately 0:100 to approximately 90:10 or from approximately 15:85 to approximately 25:75. In some embodiments using $O_2$ as the carrier gas, the $C_3H_2F_4$ comprises a volume percentage of the etchant from approximately 15 volume percent to approximately 45 volume percent, the companion gas comprises a volume percent of the etchant from approximately 15 volume percent to 50 volume percent, and the $O_2$ comprises a volume percent of the etchant from approximately 10 volume percent to approximately 40 volume percent. The ratio of ionizable gas mixture to $O_2$ is from approximately 90:10 to approximately 60:40.

In some embodiments, the plasma is generated by an RF plasma power source such as the master RF generator 140 in conjunction with at least one RF bias source such as the slave RF generators 144, 148 as illustrated in FIG. 1A. The master RF generator 140 provides a transistor-transistor-logic (TTL) signal that can be used to synchronize the pulses between the master RF generator 140 and the slave RF generators 144, 148. In some embodiments, the RF plasma power source may operate at a very high frequency (VHF) of approximately 100 MHz to approximately 200 MHz. In some embodiments, the RF plasma power source may operate at a frequency of approximately 100 MHz, approximately 121 MHz, and/or approximately 162 MHz and the like. In some embodiments, the RF plasma power source may be ramped to a peak power of approximately 3 kW to a peak power of approximately 4 kW at a ramping rate of approximately one kilowatt per second to approximately two kilowatts per second.

In some embodiments, the at least one RF bias power source may operate at a frequency of less than approximately 6 MHz. In some embodiments, a first RF bias power source may operate at a frequency of approximately 400 kHz and a second RF bias power source may operate at a frequency of approximately 2 MHz. In some embodiments, the first RF bias power source and the second RF bias power source are pulsed together. In some embodiments, the first RF bias power source and the second RF bias power are pulsed independently. In some embodiments, the frequency of the first RF bias power source and the frequency of the second bias power source are mixed with the first RF bias power source frequency of approximately 400 kHz having a voltage output approximately 60% to approximately 80% higher than a peak voltage output of the second RF bias power source frequency of approximately 2 MHz. In some embodiments, the at least one RF bias power source may be ramped to a peak power of approximately 10 kW to a peak power of approximately 15 kW at a ramping rate of approximately one kilowatt per second to approximately two kilowatts per second.

In block 208, a layer or oxide and/or nitride is etched with the assistance of at least one bias power source. The etching of the oxide is regulated by controlling the number of ions containing fluorine, F, and the etching of the nitride is regulated by controlling the number of ions containing hydrogen, H. The ratio of ions containing F to the ratio of ions containing H also yields the etching selectivity ratio of oxide to nitride. By controlling the etch gas species accordingly, an etch selectivity ratio of approximately 1:1 for oxide and nitride is achieved.

Figure 4:
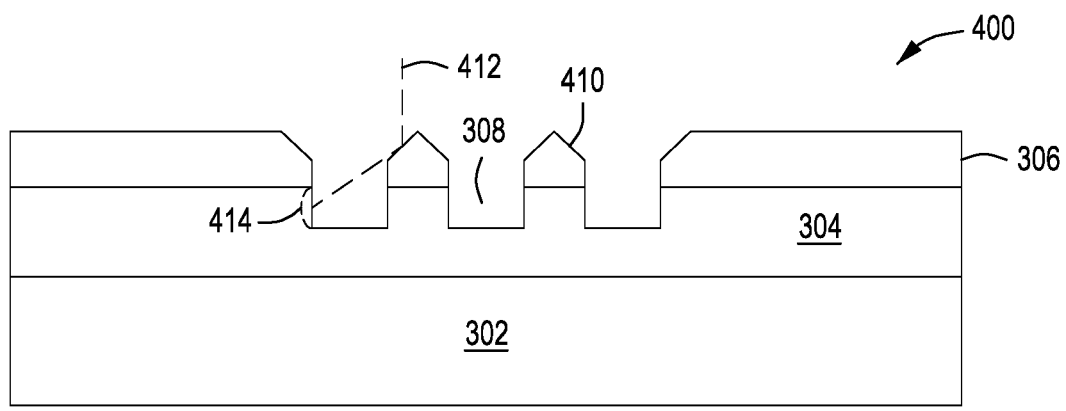
FIG. 4 is a cross-sectional view of the substrate of FIG. 3 after an etching process in accordance with some embodiments of the present principles.

The bias power source or sources accelerate ions toward a bias electrode such as the internal electrode 138 of process chamber 100 (FIG. 1A). The bias power sources help to create an anisotropic etch predominantly in the vertical direction perpendicular to the oxide or nitride layer 304. The anisotropic etching etches faster in the vertical direction than in other directions, minimizing sidewall bow of etched features in the oxide or nitride layers. As shown in a cross-sectional view 400 of FIG. 4, the gas mixture also etches the pattern mask 306. The etching process erodes the edges 410 of the openings 308 of the pattern mask 306. If etching continues, ions may be deflected (deflection path shown by arrow 412) into the sidewalls of the features causing sidewall bow 414 and deformation of the feature.

Etching is controlled in short pulses with a deposition mode in between etching modes to help protect the feature and pattern mask 516 as discussed below.

Figure 5:
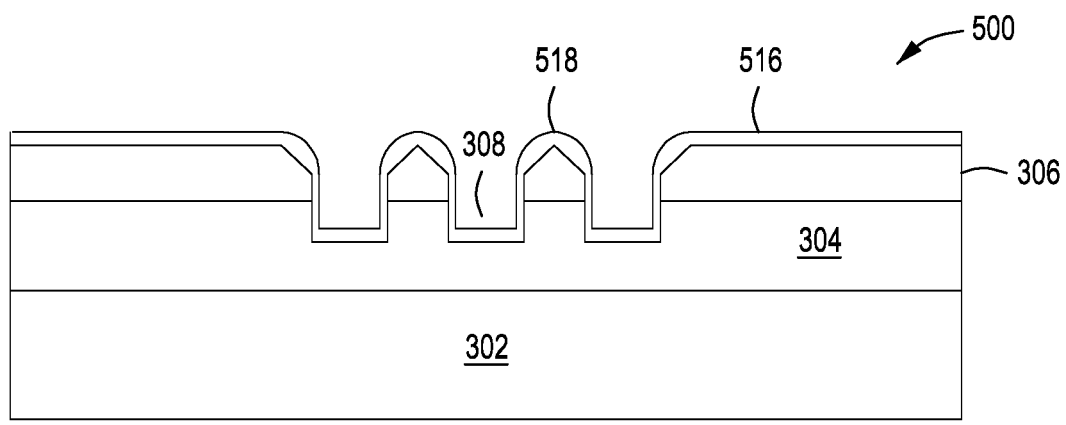
FIG. 5 is a cross-sectional view of the substrate of FIG. 4 after deposition process in accordance with some embodiments of the present principles.

In block 210, a chemically inert passivation layer 516 is deposited on the substrate 302. While maintaining the plasma, the at least one bias power source is turned OFF or reduced in power to a level that no longer affects the ions provided by the plasma. In some embodiments, the reduction in power is greater than zero and less than approximately 50 percent of biasing power. In the deposition mode, the plasma produces a conformal layer of the chemically inert passivation layer 516 on the substrate 302 using the gas mixture as shown in a cross-sectional view 500 of FIG. 5. The chemically inert passivation layer 516 protects the sidewalls of the features during etching modes and reduces sidewall bow. The chemically inert passivation layer 516 also protects the edges of the openings 308 of the pattern mask 306 with a passivation layer 'cap' 518 between the openings 308. Because etching affects the pattern mask 306 as well as the oxide or nitride layer 304, the chemically inert passivation layer 516 also aids in protecting the pattern mask 306 from being prematurely depleted during a subsequent etching mode. In some embodiments, the chemically inert passivation layer 516 may comprise a fluorocarbon based polymer or a hydrocarbon based polymer and the like.

In block 212, the plasma is interrupted by turning the plasma power source to OFF and gases and/or by-products in the process chamber 100 are pumped out by the vacuum pump 114 while the gas mixture continues to flow into the process chamber 100. In block 214, the process is repeated until an etching result is achieved. The etching result may be a given etching depth, a given etching time, and/or a touchdown to the substrate 302 under the oxide or nitride layer 304.

Figure 6:
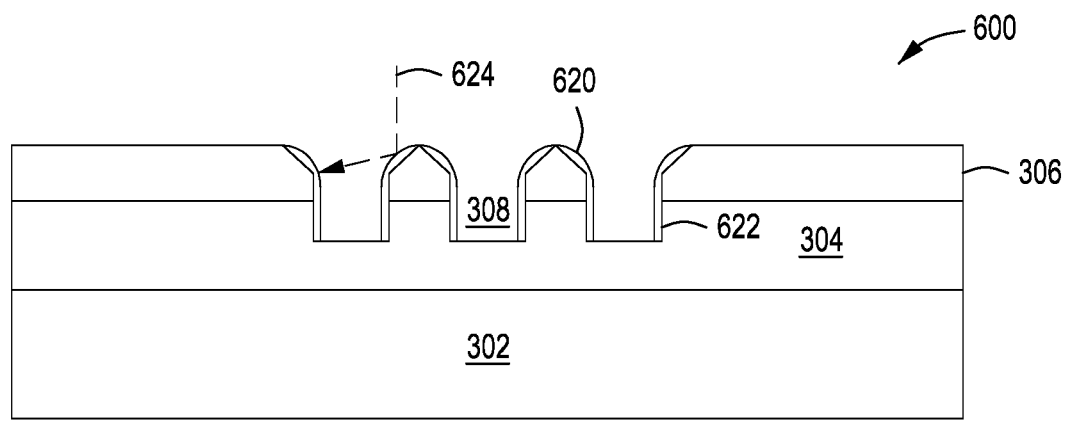
FIG. 6 is a cross-sectional view of the substrate of FIG. 5 after another etching process in accordance with some embodiments of the present principles.

One of the advantages of the method 200 is that the passivation layer cap 518 protects the edges of the openings 308 during subsequent etching modes as shown in a cross-section view 600 in FIG. 6. The anisotropic etching has etched the top of the pattern mask 306 in predominantly a vertical direction perpendicular to the surface of the pattern mask 306 and in the bottom of the openings 308. The chemically inert passivation layer 516 has been thinned out due to the etching but an etched cap 620 still provides ion deflection protection during the etching mode (as shown by ion deflection path 624). The ion deflection path 624 has a more acute angle and is deflected into the sidewall of the pattern mask 306 rather than the sidewall 622 of the opening 308, preventing sidewall bow by deflected ions.

Figure 7:
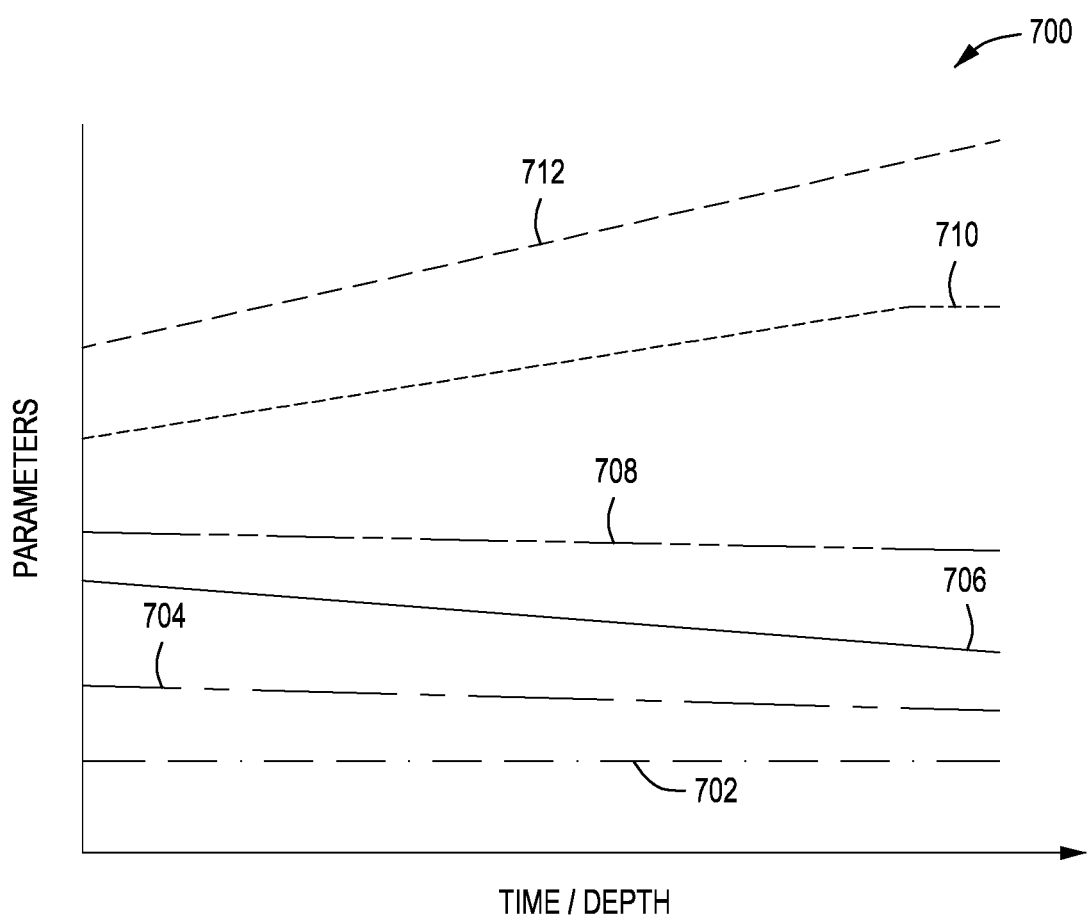
FIG. 7 is a graph of dynamically ramped parameters in accordance with some embodiments of the present principles.

In a graph 700 of FIG. 7, the dynamic ramping of various process parameters used in the method 200 is illustrated. In some embodiments, an inert gas 702 is flowed at a constant rate (zero ramping) into the process chamber 100 along with the gas mixture. In some embodiments, the pressure is increased, held constant, or, as in FIG. 7, the pressure 704 of the process chamber 100 is slowly decreased over time or etching depth. In some embodiments, the pressure ramping rate is very small such as approximately 1 mTorr per 1000 seconds and the like. The gas mixture flow rate 706 is decreased over time or etching depth. The plasma source power 708 is slowly decreased over time or etching depth. The bias source voltage 710 is increased over time or etch depth and may remain constant at some point in time or etch depth. An etch assisting gas 712 such as $O_2$ may also be ramped upward over time or etch depth to help clean areas affected by necking. The $O_2$ affects the pattern mask as a whole so the flow rate of the $O_2$ may be initially reduced to help preserve the pattern mask and then increased over time or etch depth to permit greater penetration into the feature. In some embodiments, the $O_2$ flow rate ramping may be approximately 0.01 sccm per second to approximately 0.1 sccm per second. In some embodiments, plasma source power or bias source power may have a ramping rate of approximately one watt per second to approximately two watts per second.

While the foregoing is directed to embodiments of the present principles, other and further embodiments of the principles may be devised without departing from the basic scope thereof.

The invention claimed is:

1. A method for etching a substrate, comprising:
flowing a gas mixture of $C_3H_2F_4$ and a companion gas into a process chamber;
forming a plasma from the gas mixture;
applying a pulsed DC power to an upper electrode above the substrate or to a lower electrode below the substrate;
performing an etch, via the plasma, of at least one layer on the substrate;
reducing a bias power to produce deposition of a passivation layer on the substrate; and
evacuating the process chamber while interrupting power to stop plasma formation.

2. The method of claim 1, further comprising:
forming the plasma using an RF power source and at least one RF bias power source;
pulsing the RF power source to form the plasma; and
pulsing the at least one RF bias power source to assist in ion attraction towards the substrate, wherein the pulsed DC power is synchronized with the RF power source and the at least one RF bias power source.

3. The method of claim 2, further comprising:
linking the RF power source to the at least one RF bias power source and respective impedance matching networks to adjust RF power delivery to the process chamber on an order of microseconds.

4. The method of claim 2, further comprising:
forming the plasma with the RF power source operating at a frequency of approximately 100 MHz to approximately 200 MHz; and
performing the etch with the at least one RF bias power source operating at a frequency less than approximately 6 MHz.

5. The method of claim 2, wherein the RF power source has a peak power level less than the at least one RF bias power source.

6. The method of claim 1, further comprising:
repeating the method to form at least one hole through a plurality of alternating oxide and nitride layers on the substrate to expose portions of the substrate.

7. The method of claim 1, further comprising:
performing a dynamic ramping of at least one process parameter.

8. The method of claim 7, wherein the at least one process parameter is a gas flow rate, the pulsed DC power, a bias power source, a plasma power source, or a pressure of the process chamber.

9. The method of claim 7, further comprising:
dynamically ramping the at least one process parameter based on a processing time or etch depth.

10. The method of claim 1, wherein the companion gas is a fluorocarbon gas of $C_3F_6$.

11. The method of claim 1, further comprising:
etching alternating layers of oxide and nitride on the substrate with the gas mixture of $C_3H_2F_4$ and the companion gas having an oxide to nitride selectivity of approximately 1:1.

12. A method for etching a substrate, comprising:
flowing a gas mixture of $C_3H_2F_4$ and a companion gas into a process chamber, the gas mixture having an oxide to nitride etching selectively of approximately 1:1;
forming plasma from the gas mixture;
applying a pulsed DC power to an upper electrode above the substrate or to a lower electrode below the substrate;
performing an etch, via the plasma, of at least one layer of oxide or nitride on the substrate on the substrate;
depositing a passivation layer on the at least one layer of oxide or nitride on the substrate; and
evacuating the process chamber while interrupting power to stop plasma formation.

13. The method of claim 12, further comprising:
ramping a flow rate of the gas mixture downward based on processing time or etch depth.

14. The method of claim 12, further comprising:
dynamically ramping one or more process parameters to provide active aspect ratio dependent etching control for selective reactive ion etching by depth.

15. The method of claim 12, further comprising:
generating a first RF power pulse of an RF power source to form the plasma in the process chamber;
generating a first RF bias power pulse of at least one RF bias power source during the first RF power pulse to perform the etch in conjunction with the pulsed DC power of the at least one layer of oxide or nitride on the substrate, a duration of the first RF bias power pulse being less than a duration the first RF power pulse;
depositing the passivation layer during the first RF power pulse when the first RF bias power pulse is completed; and
evacuating the process chamber when the first RF power pulse is completed.

16. The method of claim 15, further comprising:
ramping a power level of the first RF power pulse upward for subsequent RF power pulses to a peak power of approximately 3 kW to approximately 4 kW at a rate of approximately one kilowatt per second to approximately two kilowatts per second.

17. The method of claim 15, further comprising:
ramping a power level of the first RF bias power pulse upward for subsequent RF bias power pulses to a peak power of approximately 10 kW to approximately 15 kW at a rate of approximately one kilowatt per second to approximately two kilowatts per second.

18. The method of claim 15, further comprising:
ramping a power level of pulses of the RF power source or the RF bias power source upward based on processing time or etch depth.

19. A non-transitory computer readable medium having instructions stored thereon that, when executed, cause a method of operating a substrate processing system to be performed, the method comprising:
flowing a gas mixture of $C_3H_2F_4$ and a companion gas into a process chamber;
forming a plasma from the gas mixture;
applying a pulsed DC power to an upper electrode above the substrate or to a lower electrode below the substrate;
performing an etch, via the plasma, of at least one layer on the substrate;
reducing a bias power to produce deposition of a passivation layer on the substrate; and
evacuating the process chamber while interrupting power to stop plasma formation.

20. The non-transitory computer readable medium of claim 19, the method further comprising:
forming the plasma using an RF power source and at least one RF bias power source;
pulsing the RF power source to form the plasma; and
pulsing the at least one RF bias power source to assist in ion attraction towards the substrate, wherein the pulsed DC power is synchronized with the RF power source and the at least one RF bias power source.

* * * * *